United States Patent [19]

Brooks et al.

[11] Patent Number: 5,030,931

[45] Date of Patent: Jul. 9, 1991

[54] FOLDING DELAY LINE

[75] Inventors: Mark Brooks; J. Paul Ozawa; Gary L. Seibel, all of North Mankato, Minn.

[73] Assignee: Thin Film Technology Corporation, North Mankato, Minn.

[21] Appl. No.: 352,354

[22] Filed: May 16, 1989

[30] Foreign Application Priority Data

May 16, 1988 [JP] Japan ............................... 63-119078

[51] Int. Cl.[5] .......................... H01P 9/00; H03H 7/30

[52] U.S. Cl. .................................... 333/161; 333/140; 336/200

[58] Field of Search ............. 333/161, 164, 156, 140, 333/139, 138; 336/200, 232

[56] References Cited

U.S. PATENT DOCUMENTS

| | | | |
|---|---|---|---|
| 2,911,605 | 11/1959 | Wales, Jr. | 336/200 |
| 3,594,665 | 7/1971 | Metcalf et al. | 333/156 |
| 3,609,600 | 9/1971 | Kassabji et al. | 333/156 |
| 3,670,270 | 6/1972 | Stoney | 333/161 |

*Primary Examiner*—Eugene R. Laroche
*Assistant Examiner*—Seung Ham
*Attorney, Agent, or Firm*—Douglas L. Tschida

[57] ABSTRACT

A flexible laminated delay line assembly formed to include a plurality of patterned regions which may be folded into sandwiched relation to one another without affecting electrical continuity. The transmission line layer is laminated between successively adjacent dielectric and ground plane layers. Windows cut into the ground plane and dielectric layers facilitate folding and decoupling of a support spine, folding of the conductor sections and sizing of the assembly. In one construction, the dielectric layers comprise a flexible insulative substrate laminated between upper and lower thermoset layers. In another construction the dielectric layers comprise a polyetherimide that is melt flowed about the pathways of the transmission line.

14 Claims, 5 Drawing Sheets

FOLDING DELAY LINE

BACKGROUND OF THE INVENTION

The present invention relates to delay line assemblies and in particular to an improved method and construction for forming such assemblies on a flexible substrate which accommodates a fan folded packaging arrangement.

Transmission line assemblies having predetermined, equally distributed signal delay characteristics have heretofore typically been constructed on rigid substrate materials using a variety of processing techniques. The time delay characteristic of any such device being principally determined by the physical length of the transmission line. Other device characteristics of concern are the numbers and relative positioning of adjacent ground planes and the type and thickness of associated dielectric insulators separating the transmission line and ground layers, which affect the distributed inductance and capacitance.

Where too such devices are incorporated in high frequency applications, a ceramic supporting substrate material such as aluminum oxide is typically preferred. A problem attendant with the use of such substrates however is that of physical size limitations of the material for a given thickness substrate which economically limits the device size, unless multi-layering techniques are employed. Also, as additional layers are added, fabrication costs rise and yields decrease. Preferably, therefore, a maximum yield is achieved which a two dimensional assembly, but which again is limited by the physical characteristics of the substrate material.

Various rigid substrate delay line devices of which Applicant is aware can be seen in U.S. Pat. Nos. 4,641,114; 4,641,113; 3,257,629 and 2,832,935. Applicant's pending U.S. application Ser. No. 180,353 entitled Thin Film Delay Lines discloses another device which uses a rigid substrate.

As a solution to the foregoing problems, Applicant has developed a method and apparatus wherein two-dimensional processing techniques may be employed to produce a modularly organized, flexible or non-rigid assembly. Such an assembly further facilitates device construction by way of enabling fan-folding relative to multiple sections of transmission line which can further be cut to a desired length.

SUMMARY OF THE INVENTION

It is accordingly a primary object of the present invention to provide for a flexible, fan-foldable delay line construction and method for fabricating same.

It is a further object of the invention to provide for a patterned transmission line assembly including a plurality of replicated serpentine conductor pathways which are segmentable from one another without interrupting electrical continuity.

It is a further object of the invention to provide for an assembly which can be laminated from a plurality of layers that individually define a transmission line layer and one or more dielectric and ground plane layers.

It is a yet further object of the invention to provide for an assembly using either a laminated thermoset, cross-bonding dielectric layer or a flow-melt dielectric layer.

It is still another object of the invention to provide for transmission line and ground plane layers which include means for stabilizing the patterned conductor portions during assembly, yet facilitate the shearing of the laminated assembly to size without creating electrical shorting.

It is a still further object of the invention to provide for reliefs or windows/slots within the assembly to enable a fan folding of the processed assembly without affecting electrical continuity.

Various of the foregoing objects can be found in one presently preferred construction which provides for a laminated assembly including a center positioned, serpentine patterned transmission line layer. Successively laminated to each side of the upper and lower surface of the transmission line are a dielectric layer and a ground plane layer. The dielectric layer in one embodiment comprises a laminated construction which includes a thermoset PYRALUX material bonded to two sides of a center FEP insulator. Alternatively, a flow-melt polyetherimide dielectric material may be used.

The transmission line layer provides for a plurality of electrically continuous patterned sepentine conductor sections which are supported in stable relation to a perimeter border by way of a plurality of connector links, a center spine and electrical termination links. Spacing provided between each grouping of patterned sections coincides with slots and windows formed in the respective dielectric and ground plane layers. A flexible hinge region is thereby formed. The ground plane windows further facilitate folding without fracturing the transmission line. Slots let into at least one of the ground planes further prevent against electrical shorting during the sizing of the ultimately laminated assembly.

A detailed description follows of such a construction relative to the appended drawings. The following description should however not be strictly interpreted in limitation of the invention. Rather, it is provided to illustrate only one presently preferred construction and wherein the various objects, advantages and distinctions of the invention can be found. To the extent alternative constructions, improvements or modifications have been considered, they are described as appropriate.

DESCRIPTION OF THE PREFERRED EMBODIMENT

Figure 1:
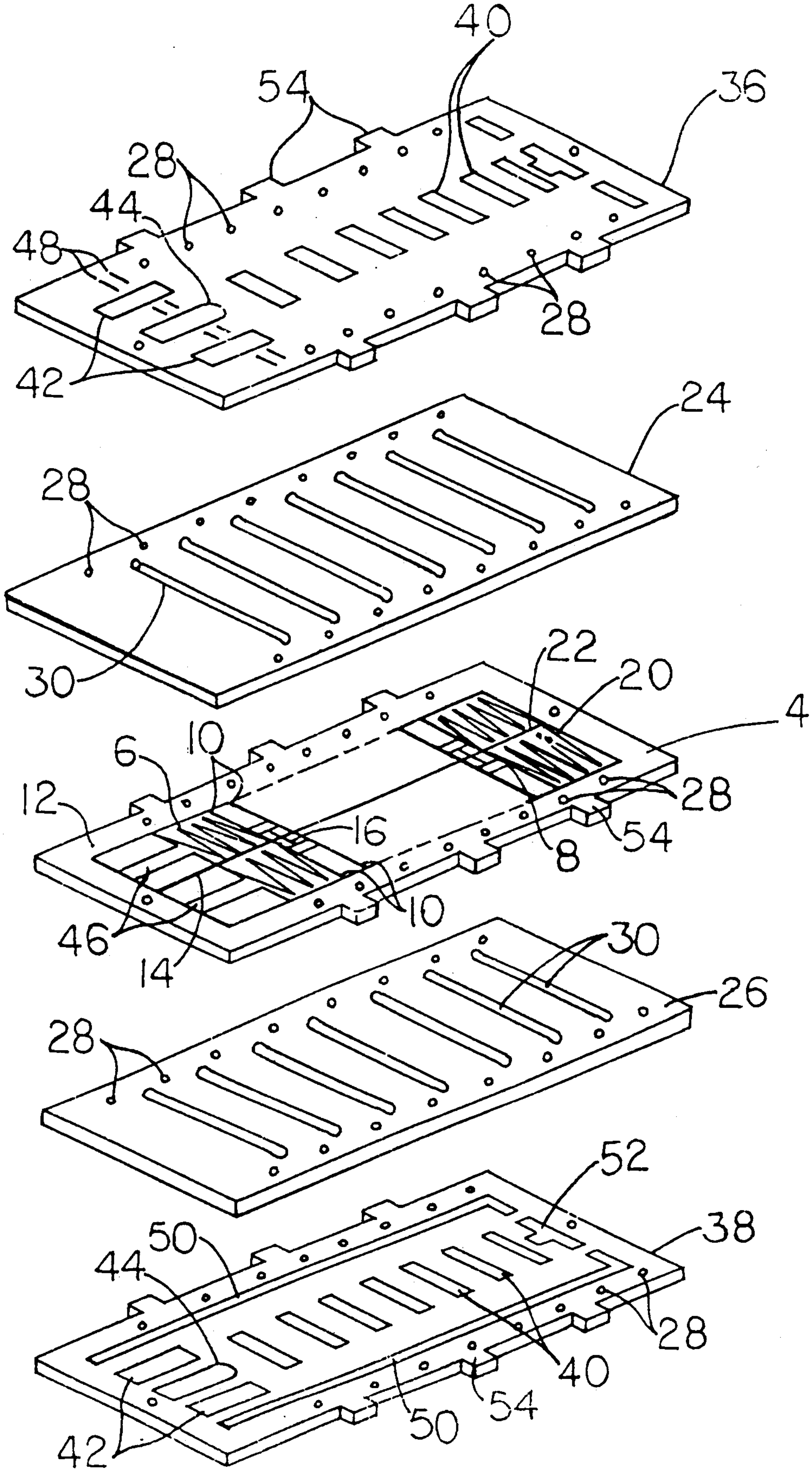
FIG. 1 shows an exploded isometric view of the laminated delay line layers of the present invention.
Figure 3:
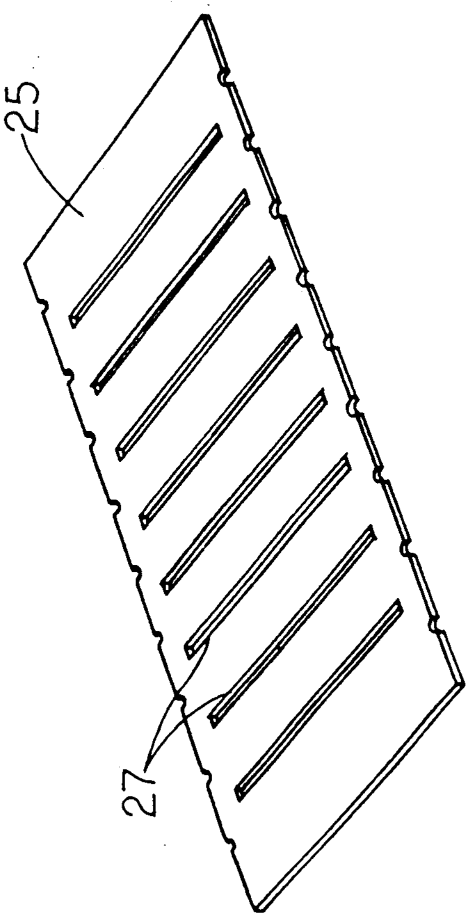
FIG. 3 shows an isometric view of a PEI dielectric layer.
Figure 6:
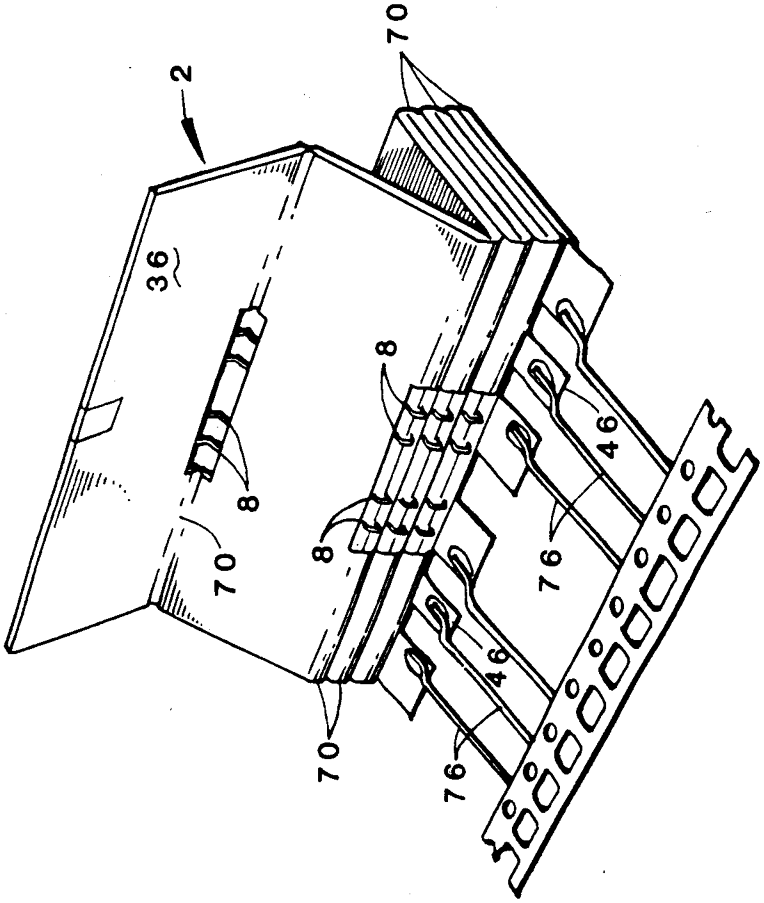
FIG. 6 shows an isometric view of a partially folded assembly.

Referring to FIG. 1, an isometric view is shown in exploded assembly of a plurality of layers which are laminated to one another to form the improved delay line assembly 2 of the present invention. FIG. 3 depicts the eventually laminated assembly of FIG. 1. FIGS. 6 and 7, in turn, depict the fan folding and ultimately packaged assembly.

Returning attention however to FIG. 1, the delay line 2 of the present invention comprises a transmission line layer 4 which includes a plurality of identically patterned serpentine conductor sections 6. The sections 6 are aligned in a pair of electrically continuous columns. Each section 6 is electrically bonded to its neighbors via pairs of redundant jumper connections 8. Each section 6 is additionally physically supported to a perimeter border or frame 12 via at least two stabilizer links 10 coupled to the top and bottom lateral edges. Alternatively, each of the adjacent windings of the conductor pathways might be stabilized to the border 12 (reference FIG. 5). For the devices presently constructed, two links 10 have however proven adequate.

Otherwise, each of the patterned conductor sections 6 are coupled to one another and stabilized along a longitudinal center spine 14 which extends between the top and bottom end portions of the border 12. Horizontal links 16 couple one of the redundant jumper links 8 of the patterned sections 6 of each column to the neighboring sections of the adjacent column and to the spine 14. Thus, each conductor section 6 is physically coupled to the perimeter border 12 via a number of retainer members 10, 14 and 16.

The continuously connected conductor sections 6 of the right column are electrically connected to the sections 6 of the left column via a lateral cross-over pathway 20 that is also linked to the spine 14 at a cross-over point 22. Termination links or connection pads 46 lastly extend from the ends of the patterned conductor to the bottom border 12, although will be described in greater detail hereinafter.

While the links 10, 14 and 16 physically restrain the patterned sections 6 to the perimeter border 12, it is necessary during subsequent processing steps to physically sever those elements which might produce undesired electrical shorting to assure the proper performance of the ultimately constructed device. This is facilitated by various reliefs formed in the layers which also will be described below.

Presently, a high purity, low resistivity copper transmission line material of a typical bulk resistivity of 2.5 ohms is used to form the layer 4. It is processed to provide for a conductive pathway of approximately 300 millimeters and exhibits a typical dynamic impedance of in the range of 25 to 75 ohms. It is to be appreciated however that a variety of other patterned metals of varying resistivities and conductor lengths may equally be employed, depending upon the application. In lieu also of uniformly organized and shaped conductor sections 6, the pattern shape of each section may be varied over the layer 4. Preferably, however, the sections are organized to some x,y coordinate arrangement which facilitates later sizing and folding.

Generally, too, the foregoing distributed delay lines 4 find particular advantage in producing time delays in the range of 0.1 through 20 nanoseconds. The particular delay depends upon the physical size of the patterned area, the length of the conductor and purity of the transmission line, among a variety of other factors.

Positioned in overlying and underlying relation to the transmission line layer 4 are identical dielectric layers 24 and 26. They can be fabricated as separately laminated assemblies or from a single sheet of a polyetherimide (PEI). In the former circumstance and which will be discussed in greater detail relative to the dielectric assembly of FIG. 2, a cross bond linking is achieved via a thermosetting material which is bonded to an intermediate dielectric layer.

A PEI material, in contrast, is a flow melt material that requires use of an autoclave. It is a more difficult material to work with due to the flowing of the material which can affect the spacing between the layers. The use of PEI dielectric for the layers 24, 26 has however been shown to provide for improved electrical device performance, while reducing the layer count from nine layers to five layers for the identical assembly 2.

Otherwise, the dielectric layers 24, 26, just as the transmission line layer 4 and ground plane layers 36,38, each provide for a plurality of registration holes 28 which extend longitudinally along the lateral edges of each layer. Laterally extending across each layer 24 and 26 between opposing pairs of the registrations 28 are a plurality of slots 30. Each of the slots 30 is formed to align with the row space 32 formed between each of the adjacent pairs of conductor sections 6 in each of the right and left columns. The space 34 between each slot is sized to not only overlap each of the conductor sections 6 but also to slightly extend beyond the top and bottom and over the space 32 to electrically shield the end conductor portions. The slots 30 also facilitate the subsequent device processing necessary to electrically disconnect the spine 14 and links 16 from the patterned sections 6, as well as to facilitate a hinging action at the ground planes 36,38 which will be described hereinafter.

Positioned, in turn, over each of the dielectric layers 24 and 26 are separate ground plane layers 36 and 38. Each of the ground plane layers 36, 38 is formed from an annealed copper. Each also provides for a plurality of rectangular window cutouts 40 which align with portions of the slots 30 at the intersection points of the spine 14 with each link members 16. Each window 40 is particularly sized to allow for flexing of the connector links 8 into the space of the window, when the assembly 2 is eventually folded (reference FIG. 7). The windows also permit insertion of a cutter to sever the link members 4, 16.

Positioned along each side of each layer 36,38 are the registration holes 28. Tabs 54 are also shown where each transmission line layer 4 is bonded to another layer 4, when constructed from a larger sheet of material. Otherwise, notches 42 and 44 are let into the bottom end of each ground plane. Once fully assembled, the connecting pads or termination link members 46 of the transmission line layer 4 are centered relative to the notches 42. The notch 44 otherwise is unoccupied in the assembly 2.

Also formed along each lateral side of each notch 42 are a pair of rectangular apertures 48. A corresponding void in the intervening dielectric and transmission line layers 24,26 and 4 facilitates bonding of the jumper or lead wires (reference FIG. 7) to the ground planes 36,38. That is, the bonding solder ]-s able to flow through the apertures 48 to contact and electrically connect both ground layers.

Upon close inspection of each of the ground plane layers 36 and 38, it is to be further noted that the layer 38 includes slotted lateral and end regions 50 and 52 which align with the connector links 10. Once laminated and during subsequent fabrication, the slots 50, 52 of at least one of the ground planes 36 or 38 serve to prevent shorting of the sheared lateral ends of the winding of each section 6 to the ground planes 36 or 38, when the border 12 is sheared from the laminated assembly 2. That is, the slots 50 and 52 define the outer portions of the assembly 2 which are sheared, once the layers 4, 24, 26, 36 and 38 are laminated to each other. Thus, any portion of the conductor sections 6 which might be pinched into contact with the adjacent ground plane during shearing is prevented when a slot 50 or 52 coincides therewith.

Figure 5:
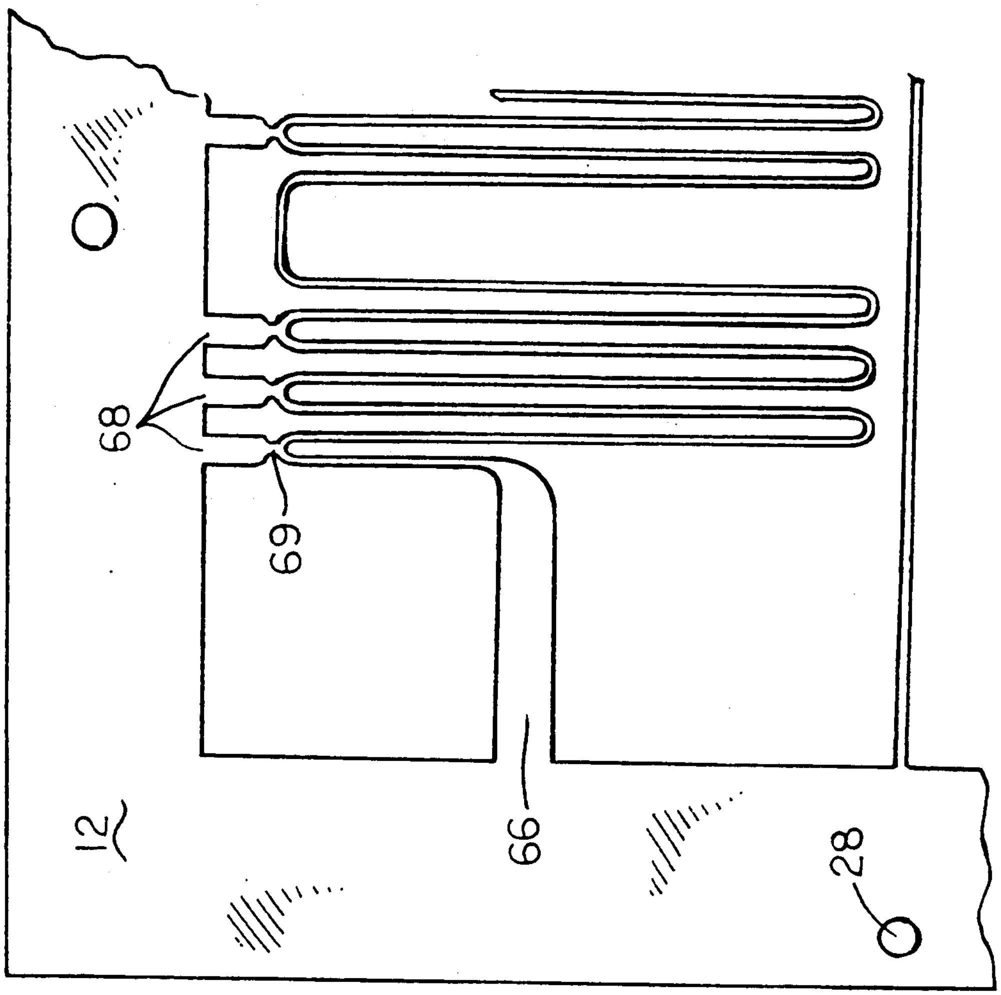
FIG. 5 shows a partial section view of a pattern configuration that permits a surface mounting of the device and includes notched connector links.

FIGS. 3 and 5 particularly show the assembly 2, before and after it is sheared. Also apparent from these views are the alignment of the connector links 10 and 16, spine 14 and termination links 46 relative to the various windows and slots 40, 42, 50 and 52.

Figure 2:
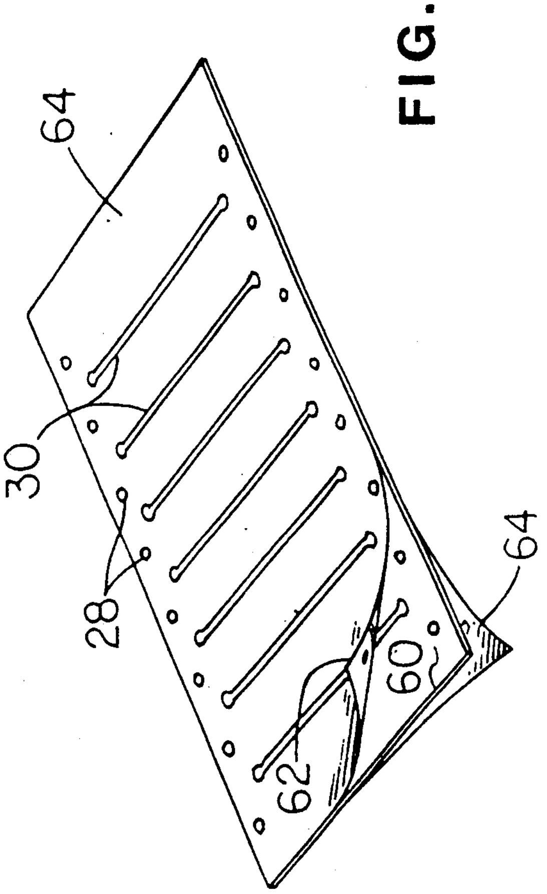
FIG. 2 shows an isometric view of an alternative laminated cross bonding dielectric insulator layer.

Turning attention to FIG. 2 and recalling that the dielectric layers 24 and 26 can be constructed of differing materials, FIG. 2 demonstrates one laminated construction wherein a layer of flexibly resilient dielectric substrate material 60, such as a flexible ethylene propylene (FEP) material, is bonded between over and underlying layers of a thermosetting adhesive 62. Alternatively, a PTFE (i.e. TEFLON) MYCAR, PCTFE, PFA, ECTFE, ETFE, PVDF, PVF, PI or other similarly flexible dielectric material may be used. Otherwise, a PYRALUX brand thermosetting adhesive is used for the layers 62 and 64. Other brands of comparable adhesives may be substituted so long as they provide adequate bonding to the adjacent layers.

Each of the layers 24, 26 are formed by aligning the layers 60, 62 and 64 over one another and after which a suitable pressure is applied to induce a sufficient heat buildup to bond the layers to one another. That is, the PYRALUX material of the layers 62, 64 is exposed to a necessary environment wherein the material becomes sufficiently tacky to adhere to the dielectric layer 62, without effecting permanent bonding. The laminated dielectric assembly 24 can then be further processed to the configurations shown in FIGS. 1 and 2 to include the necessary registration apertures 28 and slots 30, before being laminated to the transmission line and ground plane layers 4, 36 and 38.

The use of a composite dielectric construction of FIG. 2 provides for a cross link bonding between the various layers of the assembly 2. It however requires the preparation and lamination of nine layers. Not only therefore is additional fabrication time expended, but at the potential introduction of processing errors. The advantages are that the PYRALUX material thermosets at a relatively low temperature which assures that the transmission line layer 4 is not damaged during the curing step.

The assembly tasks of organizing and stacking the layers are also less susceptible to operator error and other production concerns. That is, typically each of the layers 4, 24, 26, 36 and 38 of FIG. 1 need only be positioned over one another within an assembly dye that includes pins which align with the registration apertures 28. Once each of the layers is positioned, a mating dye cover is applied. The dye is then inserted into an appropriate press to obtain a pre-determined pressure and heat buildup which produces a desired curing temperature and whereby a proper bonding of the PYRALUX to each of the adjacent layers is assured. In particular, the PYRALUX adhesively bonds each of the layers to one another across there surfaces, without deforming to flow about the pathways of the transmission line 4. In some circumstances it may also be necessary to separately heat the layers 24, 26 to evaporate any moisture trapped within the PYRALUX.

Although the use of a laminated dielectric assembly does provide for a certain simplicity of fabrication, it has been determined that electrical device characteristics can be improved by using other melt flow dielectric materials. In this regard, polyetherimides appear to provide significant advantages. Otherwise, any of the above referenced materials such as might equally be employed where they can be melt flowed without affecting the stability of the layer 4.

When using PEI and related materials, care and consideration must particularly be given to the flow characteristics of the dielectric material, since with these materials require higher temperatures to induce a controlled flowing of the material to fill voids within the adjacent layers. The spacing between the adjacent layers also varies with the curing of the dielectric which can affect the device's electrical characteristics. Accordingly from FIG. 3, it is to be noted that there are some minor differences in the shape of the slots 27 of the dielectric layer 25, in contrast to the layers 24 or 26. Otherwise, PEI materials are less moisture sensitive than PYRALUX.

Turning attention to FIG. 5, a partial section view is shown of another feature which may be incorporated into the invention, depending upon the construction of the transmission line layer 4. That is, a view is shown of an assembly 65 including termination links 66 which extend from the lateral sides of a patterned conductor section 6 to the perimeter border 12. Such links 66 particularly permit the attachment of the lead wires in a surface mount configuration in the ultimately packaged device. Otherwise, the termination links 46 of FIG. 1 provide for a conventional in line lead wire mounting (reference FIG. 7).

Also to be noted from FIG. 5 is that adjacent runs of the conductor pattern are each bonded to the perimeter border 12 via a connector link 68. This is in contrast to merely coupling the extreme ends of each pattern to the border 12, as with links 10.

A notched region 69 is also provided in each link 68 and whereat each link is sheared relative to the slots 50, 52 during subsequent assembly. The potential of electrical shorting is thereby further minimized due to the reduced width of the links 68 in the region of the notches 69. It is to be appreciated however that a variety of other link and/or notch configurations might be employed to couple and secure the section of patterned conductor 6 to the border 12, yet facilitate the shearing operation. The principle goals however are that the link constructions stabilize the conductor pattern against potential damage during handling and assembly and not be susceptible to shorting, when sheared.

An inherent advantage obtained from the present two dimensional device construction is the flexibility gained in the ultimate sizing or trimming of the length of an assembled delay line. That is, by merely cutting away one or more patterned sections at a point above a selected cross link 16, a continuous conductor pathway remains, albeit with less conductor sections 6. Accordingly and during assembly, it is possible to fabricate a standard pattern construction capable of providing a range of delays and of which a particularly desired delay can be obtained by merely shearing the assembly 2 to a desired length.

Figure 4:
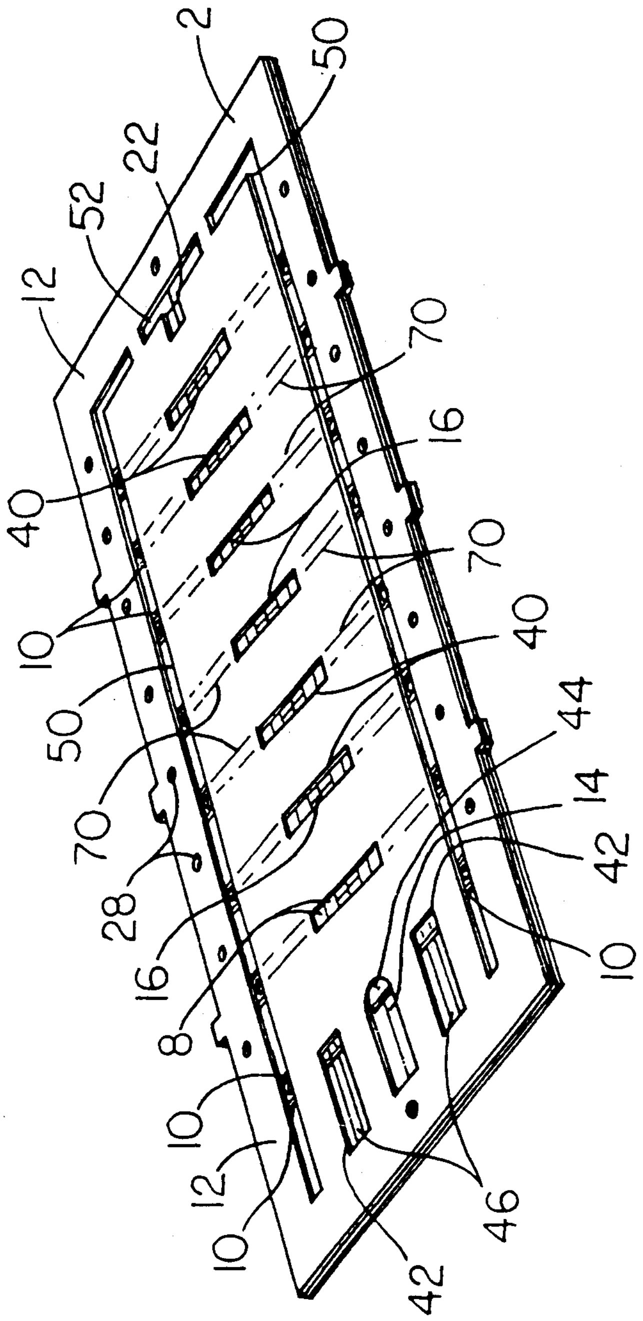
FIG. 4 shows an isometric view of the assembly of FIG. 1, when laminated and partially sheared to size.
Figure 7:
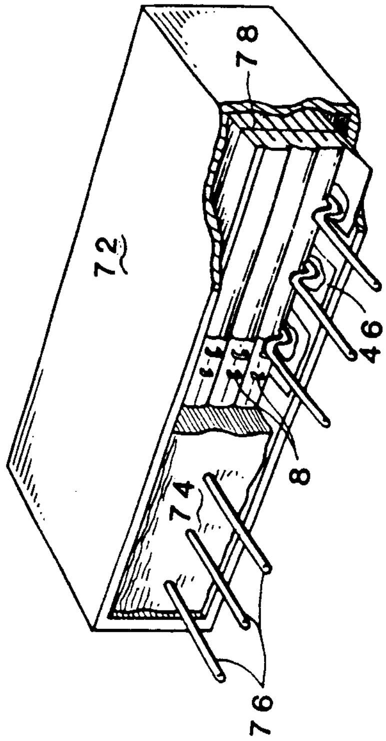
FIG. 7 shows an isometric view in cutaway of a packaged assembly.

Turning attention next to FIGS. 6 and 7, respective isometric views are shown of a partially folded assembly 2 and a cutaway view of a packaged assembly 2. From FIG. 6 and with further attention to FIG. 4, it is to be noted that, once laminated, each assembly 2 provides for a laterally indented region 70 to each side of each window 40 that extends across the assembly 2. The indentation or depression is particularly created on both the upper and lower surfaces of the assembly 2, due to the sagging of the ground planes 36, 38 relative to the slots 30 during device bonding. A flexible hinge is thus created and whereat each row of left and right adjacent pairs of patterned sections 6 can be folded into a stacked arrangement, in the fashion of FIG. 6.

Prior to folding the processed assembly 2, it is to be appreciated that a punching step occurs which severs the cross over links 16 and the spline 14 to prevent shorting of the adjacent conductor sections 6 to each other or the border 12. Otherwise, the indentations 70 act as a flexible hinge, which permits bending without undue stress and/or fracturing of the ground plane layers 36, 38 and signal layer 4. The windows 40 additionally permit the flexing of the pairs of connector links 8 through the window, which further assures electrical continuity.

Once a fabricated delay line is completely folded to size, the folds may be retained in relation to one another by way of a heat sealable band 78 (reference FIG. 7) which can be wrapped therearound. The folded assemblies can then be set aside for subsequent packaging.

Once folded, it is also to be appreciated that the physical contacting of the ground layers 36, 38 with themselves does not affect the electrical characteristics of the device. While too planar, uninterrupted ground planes 36, 38 have been shown, it is possible that patterned ground planes might be employed. Also, a foldable micro strip construction, providing for a single ground plane layer, might be designed without the sections of the patterned signal layer shorting against one another, once folded. Preferably however a pair of over and underlying ground planes would typically be employed.

Turning attention lastly to FIG. 7, a cutaway view is shown of a packaged assembly. That is, the folded delay line assembly 2 is inserted into a formed plastic carrier 72 which is potted over with a low viscosity epoxy insulator material 74. Prior thereto, the lead wires 76 are tinned and bonded to the ground planes 36, 38 at the apertures 48 and the terminator links 46 to the transmission line.

While the present invention has been described with respect to its presently preferred and various alternative embodiments, it is to be appreciated that still other constructions might suggest themselves to those of skill in the art. Accordingly, it is contemplated that the foregoing description and appended drawings should be interpreted to include all those equivalent embodiments within the spirit and scope of the following claims.

What is claimed is:

1. Laminated delay line apparatus comprising:

a) a metallic conductor layer formed to include a plurality of patterned serpentine conductor sections arranged in a plurality of rows and columns to provide a plurality of uniform spacings therebetween, a plurality of link members coupling each of said patterned sections to one another to form a signal path and to a circumscribing border portion and wherein ones of said link members may be selectively severed such that the effective length of the signal path may be varied;

b) first and second dielectric layers laminated in overlying and underlying relation to said conductor layer;

c) first and second ground plane layers laminated over said respective first and second dielectric layers; and d) means for bonding said conductor and first and second dielectric and ground plane layers to one another; and e) means for fan folding adjacent ones of said patterned conductor sections onto one another, after said conductor and first and second dielectric and ground plane layers are laminated to each other.

2. Apparatus as set forth in claim 1 wherein each of said patterned conductor sections are electrically coupled to at least one adjacent patterned conductor section via a plurality of redundant connector links.

3. Apparatus as set forth in claim 1 wherein said patterned conductor sections are arranged in a plurality of columns and said conductor layer includes at least one spine member extending between opposite portions of said border portions and between adjacent ones of said columns.

4. Apparatus as set forth in claim 3 wherein a plurality of said link members couple each of said patterned sections to said spine.

5. Apparatus as set forth in claim 1 wherein at least one of said first and second ground plane layers includes a plurality of circumscribing slots formed intermediate said border portions and said patterned conductor sections.

6. Apparatus as set forth in claim 5 wherein each of said first and second ground plane layers include a plurality of apertures which align in circumscribing relation to a plurality of link members coupling adjacent ones of said patterned conductor sections to one another.

7. Apparatus as set forth in claim 6 wherein each of said first and second dielectric layers includes a plurality of slots and wherein each of said slots aligns with the spacing between adjacent rows of said patterned conductor sections, said link members and said ground plane windows.

8. Apparatus as set forth in claim 1 wherein each of said first and second dielectric layers is comprised of a flexible dielectric member laminated between over and underlying layers of a thermosetting adhesive material.

9. Apparatus as set forth in claim 1 wherein each of said first and second dielectric layers comprise a polyetherimide material.

10. Apparatus as set forth in claim 1 wherein said signal path terminates at a plurality of termination link members coupled to a lateral side of said border.

11. Apparatus as set forth in claim 1 wherein a plurality of said link members include a notched region.

12. Apparatus as set forth in claim 1 wherein at least one of said ground plane layers includes a plurality of apertures which align with voids in the first and second dielectric and conductor layers and whereat electrical connectors may be soldered to the laminated assembly to make electrical contact between each of said first and second ground plane layers.

13. Laminated delay line apparatus comprising:

a) a metallic conductor layer formed to include a plurality of patterned serpentine conductor sections arranged in a plurality of rows and columns to provide a plurality of uniform spacings therebetween, a plurality of link members coupling said patterned sections to one another to form a signal path, to a circumscribing border portion and to a spline member extending between said border and said columns and wherein ones of said link members may be selectively severed such that the effective length of the signal path may be varied;

b) first and second dielectric layers laminated in overlying and underlying relation to said conductor layer and each including a plurality of lateral apertures which align with the row spacing;

c) first and second ground plane layers laminated over said respective first and second dielectric layers and each including a plurality of apertures which align with the apertures of said first and second dielectric layers; and d) means for bonding said conductor and first and second dielectric and ground plane layers to one another.

14. Laminated delay line apparatus comprising:

a) a metallic conductor layer formed to include a plurality of patterned serpentine conductor sections arranged in a plurality of rows and columns to provide a plurality of uniform spacings therebetween, a plurality of link members coupling said patterned sections to one another to form a signal path, to a circumscribing border portion and to a spline member extending between said border and said columns and wherein ones of said link members may be selectively severed such that the effective length of the signal path may be varied;

b) first and second dielectric layers laminated in overlying and underlying relation to said conductor laYer and each including a plurality of lateral apertures which align with the row spacing;

c) first and second ground plane layers laminated over said respective first and second dielectric layers, each including a plurality of apertures which align with the apertures of said first and second dielectric layers and at least one of which further includes an apertured region which aligns with those of said link members coupling said patterned sections to said border; and d) means for bonding said conductor and first and second dielectric and ground plane layers to one another.

* * * * *